Sept. 22, 1959 E. W. HEROLD 2,905,836

SEMICONDUCTOR DEVICES AND SYSTEMS

Filed July 27, 1955

INVENTOR.
Edward W. Herold
BY J. L. Whittaker
ATTORNEY

United States Patent Office
2,905,836
Patented Sept. 22, 1959

2,905,836

SEMICONDUCTOR DEVICES AND SYSTEMS

Edward W. Herold, Princeton, N.J., assignor to Radio Corporation of America, a corporation of Delaware Application July 27, 1955, Serial No. 524,641

13 Claims. (Cl. 307—88.5)

This invention relates to improved semiconductor devices and systems.

A typical semiconductor device known as a transistor includes a crystal of semiconductor material, which comprises the base region of the device, and an input or emitter electrode and an output or collector electrode both in rectifying contact therewith. In the operation of this type of transistor, the emitter electrode injects minority charge carriers, for example holes, into the base region when the base region is of N-conductivity type and these minority charge carriers are collected by the collector electrode whereby an output signal is produced in suitable circuitry coupled thereto.

In transistor operation analysis, a current amplification factor, known as $\alpha_{cb}$, is defined as the variation in collector current in response to a change in base current. In a typical junction transistor, as the emitter current is increased, the current amplification factor, $\alpha_{cb}$, increases initially, reaches a maximum value and then decreases steadily. This aspect of transistor operation, known as alpha fall-off, is described in a paper by W. M. Webster entitled "On the Variation of Junction-Transistor Current Amplification Factor with Emitter Current" in the Proceedings of the IRE of November 1952 (p. 914). Alpha fall-off results in part from the fact that all of the emitter current is not derived from the flow of charge carriers in one direction but that, while the emitter is injecting charge carriers into the base region, charge carriers of opposite sign also flow from the base region into the emitter.

Accordingly, an object of the present invention is to provide a novel semiconductor device and systems therefore having improved operating characteristics.

Another object of the invention is to provide an improved semiconductor device and systems therefor having reduced alpha fall-off effects.

Another object of the invention is to provide an improved semiconductor device and system for its operation wherein relatively low input impedance is achieved.

Another object of the invention is to provide an improved semiconductor device and system for its operation wherein relatively high input impedance is achieved.

A device embodying the invention comprises a body of semiconductor material including regions of P-type and N-type conductivity joined together so that minority charge carrier injection occurs from one to the other. The device also includes a rectifying electrode in contact with the P-type region and a second rectifying electrode in contact with the N-type region. The rectifying electrodes themselves may comprise regions of semiconductor material of a conductivity-type different from that of the regions they contact, so that the device may include a semiconductor body having four regions of different conductivity-type material arranged in P-N-P-N or N-P-N-P order. Alternatively, the first and second rectifying electrodes may comprise catwhiskers, rectifying metallic films or plates or they may be alloy junction or grown junction type electrodes.

When the device is employed in an operating circuit, the first-mentioned regions of P-type and N-type conductivity material are biased to operate as emitters and as base regions with respect to each other and the rectifying electrodes are biased to operate as collector electrodes with respect to the base regions which they contact. Thus, the entire device effectively comprises two transistors. One transistor includes the first-mentioned N-type region as the emitter electrode, the first-mentioned P-type region as the base region, and the first rectifying electrode as the collector electrode. The other transistor includes the first-mentioned P-type region as the emitter electrode, the first-mentioned N-type region as the base region and the second rectifying electrode as the collector electrode. In each transistor, the thickness of the base region between the emitter and collector electrodes is less than a diffusion length for minority charge carriers.

Thus, the two-transistor device of the present invention provides means not only for collecting and deriving a useful current from the charge carriers which normally flow from the emitter into the base region of a conventional transistor but also for collecting and deriving a useful output current from the charge carriers of opposite sign which normally flow from the base region into the emitter region of a conventional single transistor and reduce the efficiency $\gamma$ thereof.

The above-described device may be employed to provide low input impedance when an input signal source is coupled between the emitter regions of the two transistors and a load circuit is coupled between the collector regions of the two transistors. In addition, high input impedance may be achieved when an input signal source is coupled between the emitter regions and a separate load circuit is coupled between the emitter and collector of each transistor.

The invention is described in greater detail by reference to the drawings wherein.

Similar elements are designated by similar reference characters throughout the drawing.

Figure 1:
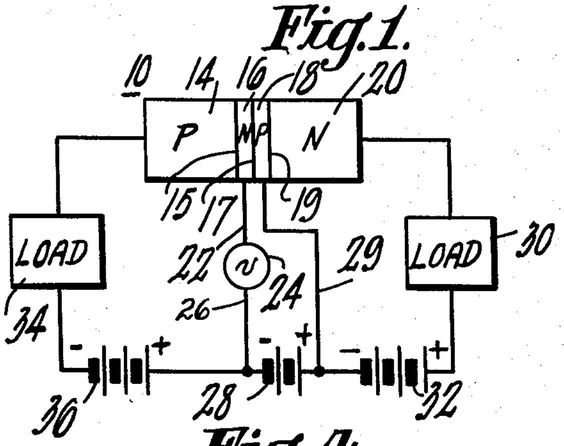
Fig. 1 is an elevational view of a semiconductor device embodying the principles of the invention and a schematic representation of a circuit in which it may be employed.

Referring to the drawing, the invention is embodied in a semiconductor device 10 including a body of semiconductor material, for example, germanium, silicon or the like, having four regions 14, 16, 18, 20 of alternating conductivity-types arranged in P-N-P-N order. If desired, the regions may be in N-P-N-P order. A rectifying barrier 15 separates the regions 14 and 16, a junction or barrier 17 separates the regions 16 and 18 and a rectifying barrier 19 separates the regions 18 and 20. The barrier 17 need not be rectifying. The regions 14, 16, 18 and 20 may be made by a conventional crystal-growing operation, for example of the Czochralski type, in which a seed crystal touches molten germanium, for example of N-type conductivity material, and, as crystallization starts, the seed is slowly withdrawn to form the region 20. P-type impurity material is then added to the molten germanium in sufficient quantity to produce the P-type material of the region 18. The regions 16 and 14 are formed in similar fashion.

Figure 2:
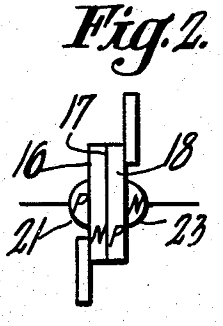
Fig. 2 is an elevational view of a first modification of the device of Fig. 1.

Alternatively, referring to Fig. 2, the N-type and P-type regions 16 and 18 may be formed by a crystal growing operation and then the appropriate P-type and N-type regions 21 and 23, respectively (corresponding to regions 14 and 20), may be formed by an alloying or fusion process of the type described generally in a paper by Law et al entitled "A Developmental Germanium P–N–P Junction Transistor" in the Proceedings of the IRE of November 1952.

Figure 3:
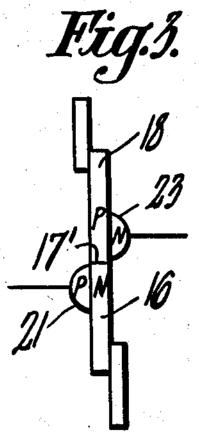
Fig. 3 is an elevational view of a second modification of the device of Fig. 1.

The zones 16 and 18 may be disposed edge-to-edge with their longitudinal axes parallel and with the junction or barrier 17 between them as shown in Fig. 2 or end to end with their longitudinal axes aligned and with a junction or barrier 17' between them as shown in Fig. 3. In Fig. 3, the regions 21 and 23 are disposed on the regions 16 and 18 in contact either with adjacent surfaces or with opposite surfaces as shown.

As still another alternative, the N and P regions 16 and 18 may be formed by a crystal growing operation and the electrodes represented by the regions 14 and 20 may be in the form of catwhiskers or plates or films of a metal in rectifying contact with the emitter regions 16 and 18.

According to the invention the device 10 comprises two transistors, one of which includes the regions 16 (emitter), 18 (base), and 20 (collector) and the other of which includes the regions 18 (emitter), 16 (base), and 14 (collector). The second and third regions 16 and 18 are operated as emitter electrodes in their separate transistors and, in addition, each functions as the base region for the other. Accordingly, the regions 16 and 18 are made to have, preferably, a thickness smaller than a diffusion length for minority charge carriers therein. Thus, in effect, the spacing between the emitter and collector of each transistor is less than said diffusion length. A thickness of two mils or less is suitable for most purposes. The thicknesses of the regions 14 and 20, respectively, which are operated as collector electrodes, are not critical.

Under some circumstances it may be desirable that the two transistors in the device 10 be balanced, that is, that they provide approximately equal currents over all parts of the operating range, from low to high currents. Balance is achieved automatically in certain circuit configurations, and can also be aided by proper choice of transistor design parameters. One set of conditions which tends to provide balanced operations is as follows:

(1) The net concentration of P-type impurities in region 18 is equal to the net concentration of N-type impurities in region 16.

(2) The thickness of the P-type region 18 is larger than the thickness of the N-type region 16 by a factor, "$b$," which is the ratio of the electron-mobility to the hole-mobility.

Referring to Fig. 1, the device 10 may be connected in a circuit which includes a connection 22 from the N-type region 16 to a signal source 24 and a connection 26 from the signal source to the negative terminal of a battery 28, the positive terminal of which is connected to the P-type region 18 by a lead 29. The N-type region 20 is connected through a suitable load 30 to the negative terminal of a battery 32, the positive terminal of which is connected to the lead 29 to the P-type region 18. Thus the N-type region 16 is biased in the forward direction with respect to the P-type region 18 and the N-type region 20 is biased in the reverse direction with respect to the P-type region 18. Thus the second, third and fourth regions 16, 18 and 20 are properly biased to comprise the emitter, base and collector regions of a first transistor.

The P-type region 14 is connected through a suitable load 34 to the negative terminal of a battery 36, the positive terminal of which is connected to the lead 26 to the signal source 24. Thus, the P-type regions 14 and 18 are biased in the forward and reverse directions, respectively, with respect to the N-type region 16. Thus, the regions 18, 16 and 14 are properly biased to comprise the emitter, base and collector regions, respectively, of another transistor.

In operation of the device and circuit of Fig. 1, the N-type emitter region 16 injects minority charge carriers (electrons) into the P-type base region 18 and these electrons are collected by the collector N-type region 20 in conventional fashion and an output current appears in the load 30. At the same time, the P-type region 18, which also is operated as an emitter electrode, injects holes into the N-type base region 16. Ordinarily, the holes thus injected would reduce the efficiency of the emitter function of the N-type region 16. However, these holes are now collected by the P-type collector region 14 and produce a useful output current in the load 34.

Figure 4:
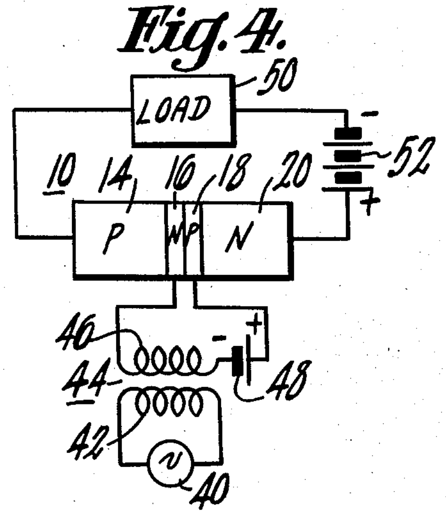
Fig. 4 shows the device of Fig. 1 and a schematic representation of another circuit in which it may be employed.

The device 10 may be employed in another circuit, referring to Fig. 4, in which an input signal source 40 is connected across the primary winding 42 of an input transformer 44, the secondary winding 46 of which is connected between the two emitter regions 16 and 18. A battery 48 is connected in the circuit of the secondary winding with the positive terminal connected to the region 18 and the negative terminal connected through the winding 46 to the region 16. The regions 16 and 18 are thus biased in the forward direction with respect to each other. The collector region 14 is connected through a suitable load 50 to the negative terminal of a battery 52, the positive terminal of which is connected to the collector region 20. The collector regions 14 and 20 are thus biased in the reverse direction with respect to the regions 16 and 18, respectively. The device 10 in the circuit of Fig. 4 employs a single load operating essentially in the same fashion as described above. It has been determined that in the circuit of Fig. 4, the device 10 operates with a low input impedance.

Figure 5:
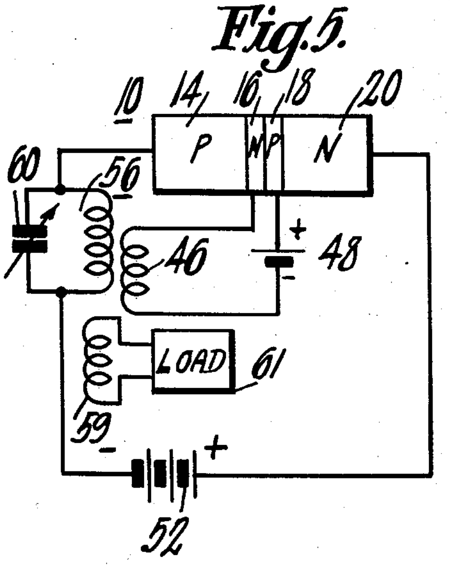
Fig. 5 shows the device of Fig. 1 and a schematic representation of still another circuit in which it may be employed; and, Fig. 6 shows the device of Fig. 1 and a schematic representation of still another circuit in which it may be employed.

Referring to Fig. 5, the device 10 is shown in an oscillator circuit which is essentially the same as the circuit of Fig. 4 except that the signal input circuit elements 40 and 42 are omitted and the load 50 is replaced by a tunable resonant circuit 56 including an inductance coil 58 and a variable capacitor 60 with suitable coupling being provided between the resonant circuit 56 and the coil 46. An output coil 59 is coupled to the coil 56 and to a suitable load device 61.

Figure 6:
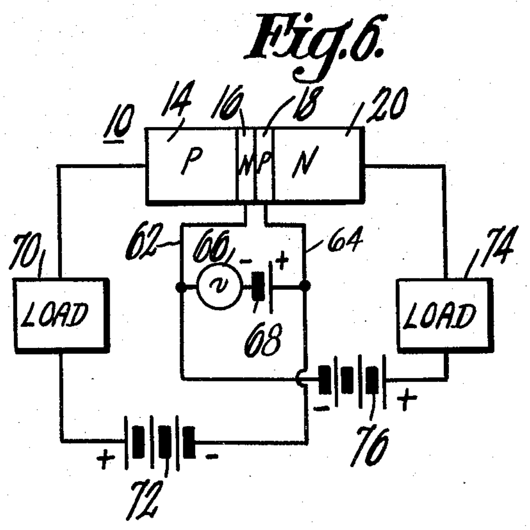

Still another circuit in which the device 10 may be employed is shown in Fig. 6 and includes a lead 62 connected to the emitter region 16 and another lead 64 connected to the emitter region 18 with a signal source 66 and a battery 68 connected between the leads 62 and 64, the battery being oriented to provide the proper forward bias for the regions 16 and 18. The collector region 14 is connected through a load 70 to the positive terminal of a battery 72, the negative terminal of which is connected to the lead 64. The collector region 20 is connected through a load impedance 74 to the positive terminal of a battery 76, the negative terminal of which is connected to the lead 62. The circuit of Fig. 6 may thus be used to obtain separate output signals from each of the collector regions and, in addition, it has been determined that the circuit provides high input impedance operation.

What is claimed is:

1. Semiconductor apparatus comprising adjacent regions of P-type and N-type conductivity semiconductor material, said regions each having a thickness less than a diffusion length for minority charge carriers, means for biasing said regions to adapt said P-type region as an emitter electrode for said N-type region as a base electrode therefor and to adapt said N-type region as an emitter electrode for said P-type region as a base electrode therefor, and an electrode in rectifying contact with each of said regions, each of said electrodes being adapted as a collector electrode for a corresponding one of said emitter electrodes.

2. Semiconductor apparatus comprising regions of P-type and N-type conductivity semiconductor material with a junction between them, said regions each having a thickness less than a diffusion length for minority charge carriers, means for biasing said regions to adapt said P-type region as an emitter electrode adapted to inject minority charge carriers into said N-type region as a base electrode therefor and to adapt said N-type region as an emitter electrode adapted to inject minority charge carriers into said P-type region as a base electrode therefor, and an electrode in rectifying contact with each of said regions, each of said electrodes being adapted as a collector electrode for a corresponding one of said emitter electrodes.

3. A semiconductor device comprising a region of N-type conductivity semiconductor material and a region of P-type conductivity semiconductor material adjacent to each other and forming a junction adapted to inject minority charge carriers from one to the other, said regions having a thickness less than a diffusion length for minority charge carriers, means for biasing said regions to adapt said P-type region as an emitter electrode for said N-type region as a base electrode therefor and to adapt said N-type region as an emitter electrode for said P-type region as a base electrode therefor, and one region of different conductivity type in rectifying contact with each of said regions, each of said one regions being adapted as a collector electrode for a corresponding one of said emitter electrodes.

4. A semiconductor device comprising adjacent regions of N-type and P-type conductivity semiconductor material, said regions each having a thickness of less than two mils, means for biasing said regions to adapt said P-type region as an emitter electrode for said N-type region as a base electrode therefor and to adapt said N-type region as an emitter electrode for said P-type region as a base electrode therefor and separate regions of different conductivity type in rectifying contact with each of said regions, each of said separate regions being adapted as a collector electrode for a corresponding one of said emitter electrodes.

5. A semiconductor device comprising a body of semiconductor material having a region of N-type conductivity and a region of P-type conductivity joined to provide minority charge carrier injection from one to the other, additional rectifying electrodes each in contact with one of said regions, said regions each having a thickness less than a diffusion length for minority charge carriers between said other rectifying electrode and said rectifying barrier, and means biasing each of said regions as emitters with respect to the one of said additional rectifying electrodes not in contact therewith.

6. Semiconductor apparatus comprising adjacent regions of N-type and P-type conductivity semiconductor material, said regions having a thickness less than a diffusion length for minority charge carriers, means biasing said regions adapt said P-type region as an emitter electrode for said N-type region as a base electrode therefor and to adapt said N-type region as an emitter electrode for said P-type region as a base electrode therefor, an electrode in rectifying contact with each of said regions, means biasing each of said electrodes as a collector electrode for a corresponding one of said emitter electrodes, a signal source coupled between said regions of N-type and P-type material, and an output circuit coupled to each of said electrodes.

7. Semiconductor apparatus comprising adjacent regions of N-type and P-type conductivity semiconductor material, said regions having a thickness less than a diffusion length for minority charge carriers, means biasing said regions to adapt said P-type region as an emitter electrode for said N-type region as a base electrode therefor and to adapt said N-type region as an emitter electrode for said P-type region as a base electrode therefor, an electrode in rectifying contact with each of said regions, means biasing each of said electrodes for use as a collector electrode for a corresponding one of said emitter electrodes, a signal source coupled between said regions of N-type and P-type material, and an output circuit coupled to each of said electrodes, said output circuit including a tunable resonant circuit.

8. Semiconductor apparatus comprising adjacent regions of N-type and P-type conductivity semiconductor material, said regions having a thickness of less than two mils, means biasing said regions to adapt said P-type region as an emitter electrode for said N-type region as a base electrode therefor and to adapt said N-type region as an emitter electrode for said P-type region as a base electrode therefor, an electrode in rectifying contact with each of said regions, means biasing each of said electrodes as a collector electrode for a corresponding one of said emitter electrodes, a signal source coupled between said P-type and N-type regions, a first load circuit coupled between said P-type region and one of said electrode and another load circuit coupled between said N-type region and the other of said electrodes.

9. Semiconductor apparatus comprising adjacent regions of N-type and P-type conductivity semiconductor material, said regions having a thickness of less than two mils, means biasing said regions to adapt said P-type region as an emitter electrode for said N-type region as a base electrode therefor and to adapt said N-type region as an emitter electrode for said P-type region as a base electrode therefor, an auxiliary N-type region in rectifying contact with said P-type region and an auxiliary P-type region in rectifying contact with said N-type region, means biasing each of said auxiliary regions as a collector electrode for a corresponding one of said emitter electrodes, a signal source coupled between said P-type and N-type regions, a first load circuit coupled between said P-type region and said auxiliary P-type region and another load circuit coupled between said N-type region and said auxiliary N-type region.

10. Semiconductor apparatus including a body of semiconductor material having four alternating regions of P-type and N-type material with each region separated from the next by a barrier, the two central adjacent regions each having a thickness less than a diffusion length for minority charge carriers and each having a thickness less than the thickness of each of the two outer regions, the ratio of thickness of the two central adjacent regions being substantially proportional to the ratio of minority carrier mobility in the respective regions, the barriers between said first and second regions and said third and fourth regions being biased in the reverse direction and the barrier between said second and third regions being biased in the forward direction whereby said second and third regions comprise emitter electrodes and said first and fourth regions comprise collector electrodes whereby said first, second and third regions operate as a first triode transistor and said second, third and fourth regions operate as a second triode transistor.

11. Semiconductor apparatus including a body of semiconductor material comprising first, second, third and fourth regions alternating in conductivity type with each region separated from the next by a barrier, the two central adjacent regions each having a thickness less than a diffusion length for minority charge carriers and each having a thickness less than the thickness of each of the two outer regions, the ratio of thickness of the two central adjacent regions being substantially proportional to the ratio of minority carrier mobility in the respective regions, the barriers between said first and second regions and said third and fourth regions being biased in the reverse direction and the barrier between said second and third regions being biased in the forward direction whereby said second and third regions comprise emitter electrodes and said first and fourth regions comprise collector electrodes, a signal source coupled between said second and third regions, and an output circuit coupled to said first and fourth regions, said first, second and third regions comprising a first triode transistor and said second, third and fourth regions comprising a second triode transistor.

12. A semiconductor device comprising a region of N-type conductivity semiconductor material and a region of P-type conductivity semiconductor material, said regions having longitudinal axes and placed edge to edge with their longitudinal axes parallel, said regions having a thickness less than a diffusion length for minority charge carriers, means for biasing said regions to adapt said P-type region as an emitter electrode for said N-type region as a base electrode therefor and to adapt said N-type region as an emitter electrode for said P-type region as a base electrode therefor, and an electrode in rectifying contact with each of said regions, each of said electrodes being adapted for use as a collector electrode for one of said emitter electrodes.

13. A semiconductor device comprising a region of N-type conductivity semiconductor material and a region of P-type conductivity semiconductor material, said regions having longitudinal axes and placed end to end with said axes aligned, said regions having a thickness less than a diffusion length for minority charge carriers, means for biasing said regions to adapt said P-type region as an emitter electrode for said N-type region as a base electrode therefor and to adapt said N-type region as an emitter electrode for said P-type region as a base electrode therefor, and an electrode in rectifying contact with each of said regions closely adjacent to said rectifying barrier, each of said electrodes being adapted for use as a collector electrode for one of said emitter electrodes.

References Cited in the file of this patent

UNITED STATES PATENTS

| | | |
|---|---|---|
| 2,569,347 | Shockley | Sept. 25, 1951 |
| 2,623,103 | Kircher | Dec. 23, 1952 |
| 2,655,610 | Ebers | Oct. 13, 1953 |
| 2,691,073 | Lowman | Oct. 5, 1954 |
| 2,735,948 | Sziklai | Feb. 21, 1956 |
| 2,778,956 | Dacey et al. | Jan. 31, 1957 |
| 2,838,617 | Tummers | June 10, 1958 |

OTHER REFERENCES

"Four Terminal PNPN Transistors," Ebers, Pro. of IRE, 1952, pages 1361 to 1364.

"Transistors: Theory and Application, part VI," Coblenz and Owens, Electronics, August 1953, pages 156–161.